United States Patent
Kozlowski

[11] Patent Number: 5,885,468
[45] Date of Patent: Mar. 23, 1999

[54] MICROMECHANICAL COMPONENT AND PRODUCTION METHOD

[75] Inventor: Frank Kozlowski, Grafrath, Germany

[73] Assignee: Siemens Aktiengesellschaft, Munich, Germany

[21] Appl. No.: 750,499

[22] PCT Filed: Jul. 3, 1995

[86] PCT No.: PCT/DE95/00855

§ 371 Date: Dec. 9, 1996

§ 102(e) Date: Dec. 9, 1996

[87] PCT Pub. No.: WO96/01483

PCT Pub. Date: Jan. 18, 1996

[30] Foreign Application Priority Data

Jul. 4, 1994 [DE] Germany .......................... 44 23 396.5

[51] Int. Cl.[6] .................................................. C23F 1/00
[52] U.S. Cl. ............................. 216/2; 428/143; 428/147; 428/156; 428/166; 428/421; 428/422; 216/11; 73/514.32; 73/514.36; 73/514.37; 361/280; 257/415; 438/52
[58] Field of Search .................................... 428/143, 147, 428/156, 166, 421, 422; 427/534; 257/415; 73/514.32, 514.36, 514.37; 216/2, 11; 361/280; 438/52

[56] References Cited

U.S. PATENT DOCUMENTS

| | | | |
|---|---|---|---|
| 3,846,166 | 11/1974 | Saiki et al. ................................. | 29/625 |
| 4,849,070 | 7/1989 | Bly et al. .................................. | 156/643 |
| 5,258,097 | 11/1993 | Mastrangelo ............................. | 156/644 |
| 5,260,596 | 11/1993 | Dunn et al. .............................. | 257/414 |
| 5,326,726 | 7/1994 | Tsang et al. ............................. | 437/228 |
| 5,367,429 | 11/1994 | Tsuchitani et al. ..................... | 361/280 |
| 5,447,600 | 9/1995 | Webb ......................................... | 216/2 |
| 5,640,039 | 6/1997 | Chau et al. .............................. | 257/417 |
| 5,679,436 | 10/1997 | Zhao ...................................... | 428/141 |

FOREIGN PATENT DOCUMENTS

| | | |
|---|---|---|
| 42 34 969 A1 | 4/1993 | Germany . |
| 43 38 423 A1 | 5/1994 | Germany . |
| 43 32 843 A1 | 4/1995 | Germany . |

OTHER PUBLICATIONS

Proceedings IEEE Micro Electro Mechanical Systems, IEEE Catalog No. 94CH3404–1, New York, "Materials Analysis of Fluorocarbon Films, for MEMS Applications", J. Elders et al, pp. 170–175.

Patent Abstracts of Japan, vol. 17, No. 91, (E–1324) 23 Feb. 1993; & JP 42 86 165 dated 12 Oct. 1992, T. Junichi et al, Minute Machine and Manufacture Thereof, 1 page.

Japanese Journal of Applied Physics, Part 2, (Letters), vol. 32, No. 11A, "Photoresist–Assisted Release of Movable Microstructures", D. Kobayashi et al, Nov. 1, 1993, pp. L1642–L1644.

*Primary Examiner*—William P. Watkins, III
*Attorney, Agent, or Firm*—Hill & Simpson

[57] ABSTRACT

The component has a movable section (2) over a substrate (1), in which spacers (3) preferably made of fluorocarbon are present on the top side of the substrate and prevent the movable section from adhering to the support.

2 Claims, 2 Drawing Sheets

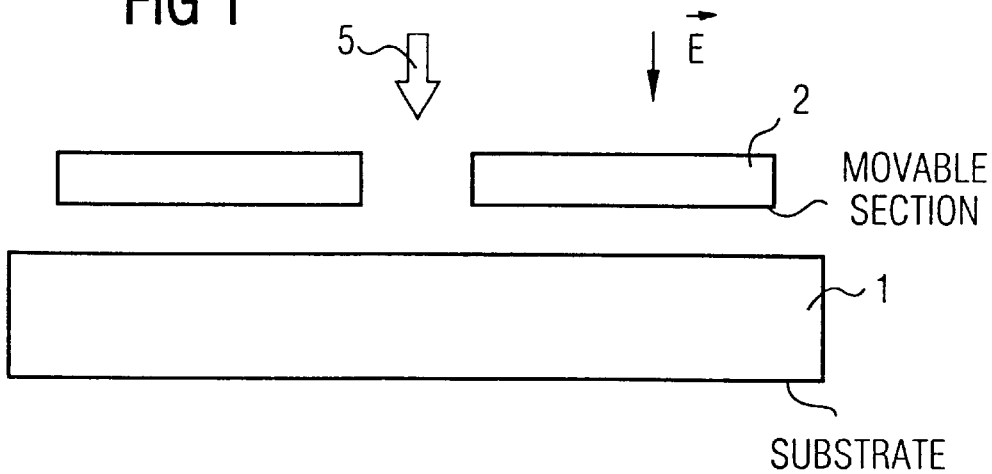
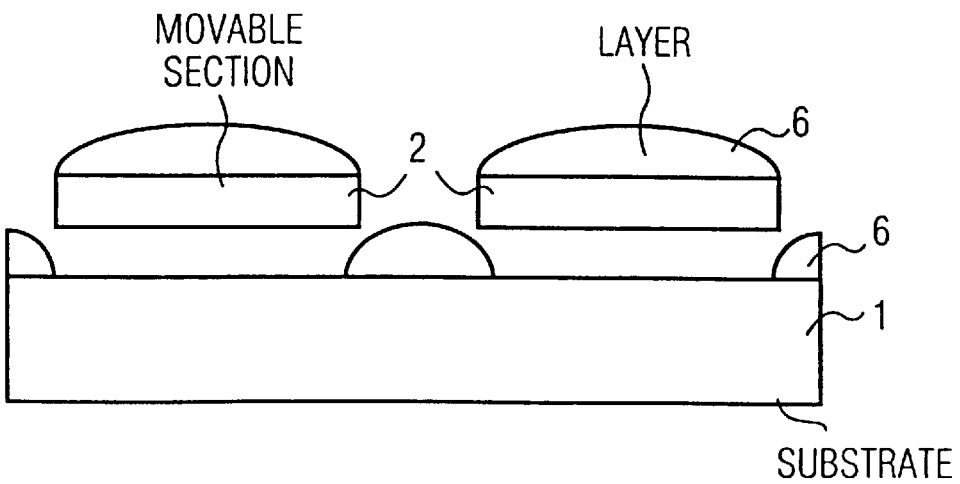

MICROMECHANICAL COMPONENT AND PRODUCTION METHOD

BACKGROUND OF THE INVENTION

Both in use and during production, movable elements of micromechanical components, for example sensors or actuators, encounter the problem of the movable part adhering to the support. This so-called "sticking" occurs during production as a consequence of strong capillary forces during the drying of the liquids used during and after etching. When the component is used, in the event of an excessive displacement of the movable part toward the substrate, it is possible for such an intimate contact between this part and the surface of the substrate to occur that the part no longer detaches from the surface.

The publication by D. Kobayashi et al.: "Photoresist-Assisted Release of Movable Microstructures" in Jpn. J. Appl. Phys. 32, L1642–L1644 (1993) describes a method by which, using additional layers of photoresist, a movable part provided for a micromechanical component is detained in such a way that a wet-chemical etching process can take place without the movable part adhering to the support. The photoresist is subsequently removed by ashing in an oxygen plasma.

SUMMARY OF THE INVENTION

The object of the present invention is to specify a micromechanical component, in which sticking of a movable section of the surface structure to the substrate is prevented, and an associated production method therefor.

In general terms the present invention is a micromechanical component having a movable section, arranged at a distance over a substrate, of a micromechanical structure. Spacers are present on a top side, facing the movable section, of the substrate, between the movable section and the top side. The spacers are dimensioned such that sticking of the movable section to the substrate or to the spacers is prevented.

In one embodiment the spacers are made of a fluorocarbon.

The present invention is also a method for the production of a component as described above. In the method a sacrificial layer and a structure layer are applied to a substrate. The structure layer is structured in accordance with the movable section to be produced. The sacrificial layer is at least partially removed between the movable section and the substrate. Portions of a layer made of a material provided for the spacers are deposited between the section and the substrate. The layer is etched back to the envisaged spacers.

Advantageous developments of the present invention are as follows.

The layer made of a material provided for the spacers is deposited with an uneven layer thickness by utilizing the shading effect of that portion of the structure layer which is provided for the movable section.

The deposition is carried out as the divergent deposition of fluorocarbon in a plasma reactor under the action of an electric field directed toward the substrate.

The sacrificial layer is removed, with the exception of residues which remain between that portion of the structure layer which is provided for the movable section and the substrate. This prevents sticking of the movable section to the substrate or to the spacers during subsequent method steps. After etching back the layer for the spacers, these residues of the sacrificial layer are removed in a further step.

In the component according to the invention, small spacers made of a separately applied material are present on the surface of the substrate, between the substrate and the movable section of the micromechanical structure. These spacers cause the top side of the substrate to become so uneven that the movable section, that is to say the movable element of the component, can come into contact with these spacers only at a few points, thereby preventing sticking to the substrate.

These spacers are preferably produced after a sacrificial layer and a structure layer, provided for the production of the movable part, have been deposited on a substrate, the structure layer has been structured in accordance with the movable section to be produced and the sacrificial layer has been at least partially removed at least in the regions provided for the spacers. A residue of the sacrificial layer preferably remains as a support for the movable part between the structure layer and the substrate while the steps for producing the spacers are carried out. A layer made of a material which is provided for the spacers is then deposited in such a way that portions thereof end up between that region of the structure layer which is provided for the movable section and the substrate. The portions of the sacrificial layer which have previously been wet-chemically removed are in this way at least partially refilled. If portions of the sacrificial layer which still remain subsequently have to be removed, the material which is deposited for the spacers is chosen in such a way that it is resistant to this subsequent etching process. If the conditions during the deposition of the layer have been chosen in such a way that the thickness of the layer below that portion of the structure layer which is provided for the movable section is smaller, owing to the shading effect of the structure layer, than the layer thickness at the freely accessible points, the micromechanical structure, that is to say in particular the movable section, can only come into contact with the base at certain points following the removal of the excess layer components. If the micromechanical elements are already completely exposed, that is to say the relevant section of the structure layer is freely movable, the layer deposited for the spacers does not have to be resistant to etchant. The material preferably used for this layer is a fluorocarbon, which can be deposited, for example, in a plasma reactor under the action of an electric field.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIGS. 1, 2 and 3 show intermediate products of a component according to the invention in cross section after different steps of the production method.

DESCRIPTION OF THE PREFERRED EMBODIMENTS

Figure 3:
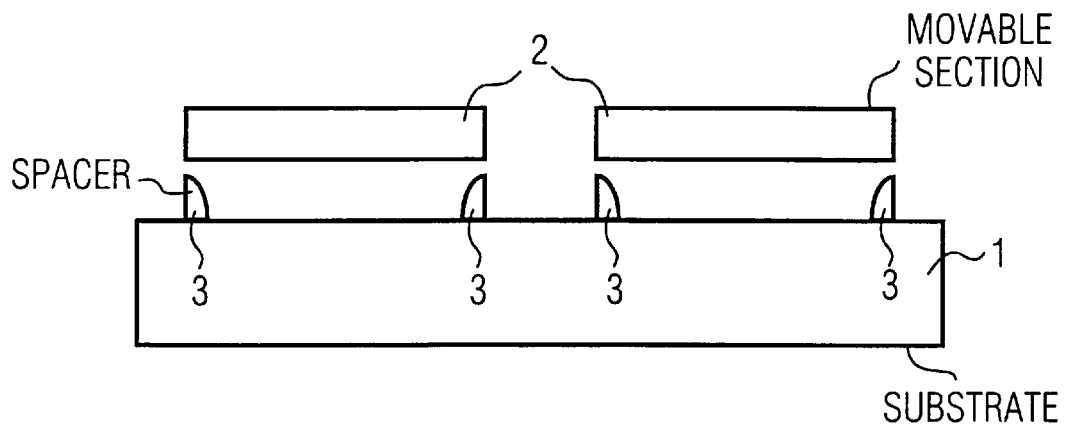

FIG. 1 illustrates, over a substrate 1 which may be a semiconductor wafer, a semiconductor layer structure or the like, a movable section 2, that is to say a movable part of the micromechanical component, at a distance from this substrate 1. For the sake of simplicity, the suspension means of this section 2 and those parts of the component which are arranged behind the plane of the drawing in the viewing direction are omitted. This structure is produced, for example, as described at the beginning in that a sacrificial layer and on top of that a structure layer made of the material provided for the movable part are applied to the substrate 1. The structure layer is structured in accordance with the envisaged component; the sacrificial layer is then removed. The material provided for the spacers is then applied as a layer approximately in the direction of the double arrow 5 illustrated in FIG. 1. The deposition is not carried out completely anisotropically here, but rather divergently, with the result that portions of the applied layer 6 are also applied under the movable section 2, as shown in FIG. 2. In the event of deposition in a plasma reactor, the deposition can be assisted, for example, by an electric field which is directed at the substrate 1 and is illustrated in FIG. 1 by the single arrow.

The deposited layer 6 is, for example, preferably fluorocarbon. In accordance with the illustration of FIG. 2, the effect achieved by the slightly divergent deposition is that this layer is deposited in the form of first uneven layer portions on the substrate and in the form of second layer portions on the movable section 2. If the deposition conditions are chosen in such a way that the layer thickness under the movable section 2 is thinner than that at the freely accessible points, which results from the shading effect of the movable section 2, then the movable section can subsequently come into contact with the base only at a few points. It is possible to terminate the method at the state illustrated in FIG. 2, since here, already, sticking of the movable sections of the micromechanical structure to the base is avoided. If the second layer portions on the surface of the movable section are in the way, strongly anisotropic etching of this layer 6 is carried out, the effect of which is that only the small spacers 3 shown in FIG. 3 remain.

FIG. 3 shows a cross section of an exemplary embodiment of the component according to the invention. When the movable sections 2 move, the spacers 3 prevent the movable sections from touching the substrate. The spacers are so small that the possible contact area between the spacers and the movable section is so small that the movable section does not adhere to the spacers during operation of the component. The spacers likewise prevent contact between the movable section and the substrate.

Figure 4:
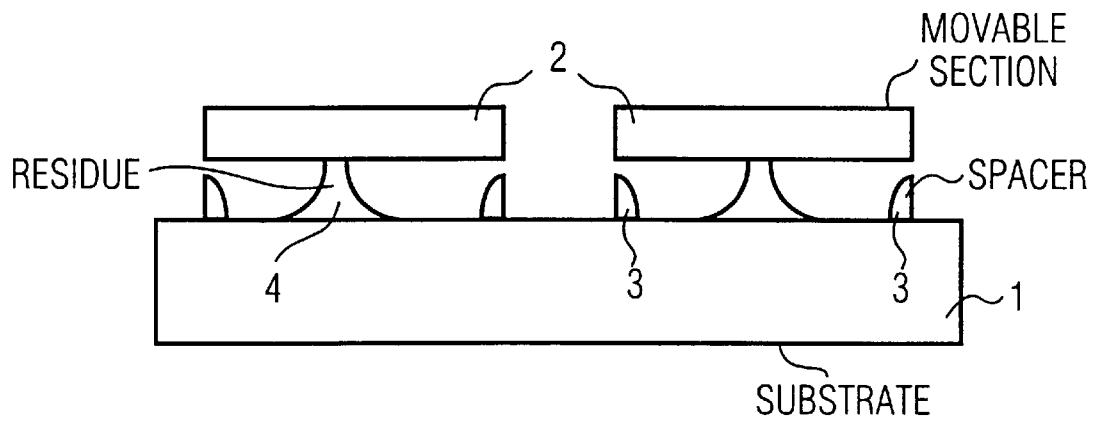
FIG. 4 shows an intermediate product of a component according to the invention after an alternative production step.

FIG. 4 shows a cross section of an intermediate product during the production of a component according to the invention, after the production of the spacers. In this embodiment, residues 4 of the sacrificial layer have remained between the structure layer and the substrate. These residues 4 support that portion of the structure layer 2 which is provided for the movable section, until the spacers 3 are produced. The residues 4 prevent the structure layer from sticking to the top side of the substrate during drying of the wet-chemical etching solution used for the removal of the sacrificial layer. Movement of the structured sections during the production of the spacers is also prevented. The residues 4 of the sacrificial layer can be removed before or after anisotropic etching for producing the small spacers and for removing those portions of the layer 6 which have been deposited on the structure layer. Instead of the residues of the sacrificial layer, it is possible to use, for example, provisional spacers made of photoresist, PMMA or a polymer, preferably polystyrene, for example, in accordance with the Kobayashi publication mentioned in the introduction. The component according to the invention is preferably produced using silicon.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for producing a component having a movable section, arranged at a distance over a substrate, of a micromechanical structure, having spacers on a top side, facing said movable section, of said substrate, between said movable section and said top side, the spacers being dimensioned such that sticking of the movable section to the substrate or to the spacers is prevented, having the steps of:

a) applying a sacrificial layer and a structure layer to a substrate;

b) structuring said structure layer such that said movable section is produced;

c) at least partially removing said sacrificial layer between said section and the substrate, except for residues which remain between that portion of the structure layer which is provided for the movable section and the substrate;

d) depositing portions of a spacer layer made of a material provided for the spacers between said section and the substrate, the deposition is carried out as a divergent deposition of fluorocarbon in a plasma reactor under action of an electric field directed toward the substrate;

e) etching back said spacer layer to the spacers which do not touch the structural layer; and f) removing the residues of the sacrificial layer.

2. The method as claimed in claim 1, wherein, in step d, the spacer layer is deposited with an uneven layer thickness by utilizing a shading effect of that portion of the structure layer which is provided for the movable section.

* * * * *